United States Patent [19]

Seipler

[11] Patent Number: 4,912,601
[45] Date of Patent: Mar. 27, 1990

[54] MULTIPLE-PLATE HYBRID DEVICE

[75] Inventor: Dieter Seipler, Reutlingen, Fed. Rep. of Germany

[73] Assignee: Robert Bosch GmbH, Stuttgart, Fed. Rep. of Germany

[21] Appl. No.: 290,169

[22] PCT Filed: May 9, 1987

[86] PCT No.: PCT/DE87/00218
§ 371 Date: Dec. 7, 1988
§ 102(e) Date: Dec. 7, 1988

[87] PCT Pub. No.: WO88/00396
PCT Pub. Date: Jan. 14, 1988

[30] Foreign Application Priority Data

Jun. 30, 1986 [DE] Fed. Rep. of Germany ....... 3621930

[51] Int. Cl.⁴ .............................................. H05K 7/20
[52] U.S. Cl. ..................... 361/388; 361/396; 361/413; 165/185; 439/487

[58] Field of Search ............. 200/307; 165/80.2, 80.3, 165/185; 439/69, 485, 487; 361/386, 387, 388, 393, 394, 395, 396, 412, 415, 424, 429, 413

[56] References Cited

U.S. PATENT DOCUMENTS

| | | | |
|---|---|---|---|
| 3,963,301 | 6/1976 | Stark | 361/413 |
| 4,179,172 | 12/1979 | Godsey | 361/413 |
| 4,203,147 | 5/1980 | Gabr | 361/395 |
| 4,225,900 | 9/1980 | Ciccio | 361/403 |
| 4,339,628 | 7/1982 | Marcantonio | 361/396 |
| 4,549,200 | 10/1985 | Ecker | 361/395 |
| 4,597,291 | 7/1986 | Motomiya | 361/395 |

Primary Examiner—Gerald P. Tolin
Attorney, Agent, or Firm—Michael J. Striker

[57] ABSTRACT

A multiple-plate hybrid device with integrated heat dissipation for thick-film hybrid substrates containing hybrid circuits in which the thick-film hybrid substrates are inserted in metal frames of a metal housing and at least partially coupled with portions of the metal frames for dissipating the occurring heat.

9 Claims, 1 Drawing Sheet

MULTIPLE-PLATE HYBRID DEVICE

BACKGROUND OF THE INVENTION

The invention relates to a multiple-plate hybrid device with integrated heat dissipation. An integrated hybrid circuit designates a microcircuit in which passive components such as resistors, capacitors and small inductances, including their interconnections, are produced as a film circuit. Active components and possibly also simple integrated circuits are then used in this partial circuit as semiconductor components. While the modular type construction of devices has already been in use for a long time, it has found little use in hybrid technology. Generation of heat during the operation of hybrid substrates and its elimination may be the most substantial obstacle. This is particularly true when arranging a plurality of hybrid substrates in a compact space.

SUMMARY OF THE INVENTION

The object of the invention is to provide a multiple-plate hybrid device with integrated favorable heat dissipation. According to the invention, this object is achieved by inserting thick-film hybrid substrates in metal frames of a metal housing and by coupling the hybrid substrates at least partially with the portions of the metal frames. The hybrid device of the invention has the advantage that a plurality of layers of hybrid substrates, particularly thick-film hybrid substrates, can be used which have a favorable thermal dissipation, a very high density of components and thus a modular construction assembly occurs with almost unlimited possibilities of expansion.

Metal frames with and without heat dissipation can be considered as metal frames for holding the thick-film hybrid substrates. The metal frames with heat dissipation should comprise a metal plate for contacting the thick-film hybrid substrate and should overlap the thick-film hybrid substrates with side legs while forming guide grooves. The heat dissipation is improved when the thick-film hybrid substrates are glued on the metal plates.

However, it can also be necessary, depending on requirements, to arrange metal frames for substrates which should not come into contact with metallic enveloping surfaces. Such intermediate carriers consist of frames which are located opposite one another, guide grooves being formed in the end faces of the latter, which face one another, for insertion of thick-film hybrid substrates.

It is possible in this way to produce a desired module and reduce and expand it with the modular construction principle. The number of desired metal frames with inserted thick-film hybrid substrates are then screwed together. In this way, a compact metal housing is formed with a very favorable capability for a thermal coupling.

The back of this metal housing is covered by a cover which engages a correspondingly arranged sealing groove on the back of the metal housing with an annular projection.

Another important feature of the invention is the solution of the problem of the interconnection between the thick-film hybrid substrates, which are arranged in the metal housing and outside of the housing. For this purpose, the connection lugs projecting from the thick-film hybrid substrates are to be brought together by a connection board or punched grid. This connection board is covered with a masking section on the front of the metal housing, wherein a plug penetrates this masking section and engages in the connection board with contact plug pins. The contact pins end e.g. in contact holes of the plug, wherein these contact holes are accessible from the outside. Accordingly, a suitable connection is produced between the hybrid circuit and the outside of the housing.

The connection board or punched grid, for example, a printed circuit board, can be rigid or flexible.

The invention as to its construction so to its mode of operation, together with additional objects and advantages thereof, will be best understood from the following description with reference to the appended drawings.

DESCRIPTION OF THE PREFERRED EMBODIMENTS

Figure 1:
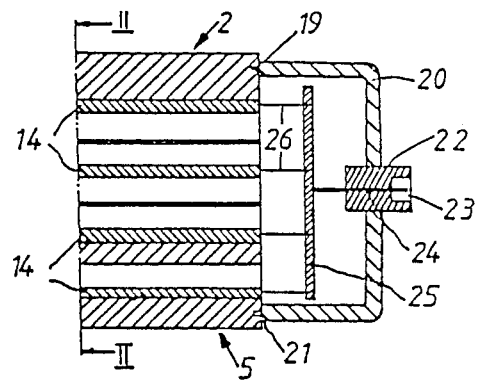
FIG. 1 shows a partial longitudinal sectional view of a multiple-plate hybrid device according to the invention.
Figure 2:
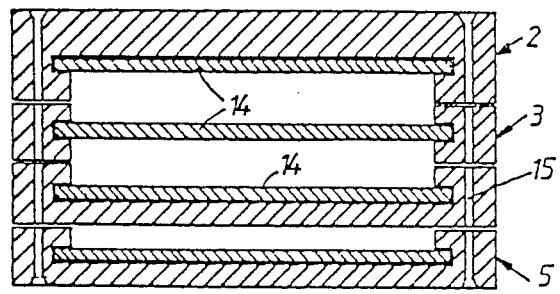
FIG. 2 shows a cross-sectional view of the multiple-plate hybrid device according to FIG. 1 along line II—II.
Figures 3, 4:
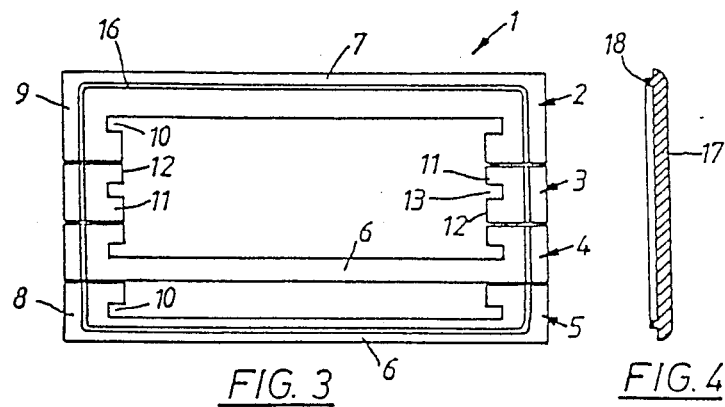
FIG. 3 shows a rear view of a metal housing of the multiple-plate hybrid device.
FIG. 4 shows a cross-sectional view of a cover section for covering the back of the multiple-plate hybrid device.

A multiple-plate hybrid device with integrated heat dissipation, according to FIGS. 1-3, comprises a metal housing 1 consisting of metal frames 2-5 which are stacked one above the other. In the present embodiment, a cover frame 2 and a base frame 5 are shown, an intermediate carrier frame 3 and another intermediate carrier frame 4 with heat coupling being arranged between them.

The cover frame 2, base frame 5 and intermediate carrier frame 4 with heat coupling have an approximately U-shaped cross section, wherein legs 8 and 9, respectively, project laterally from a metal plate 6 and 7, respectively, and form oppositely located guide grooves 10 with the metal plate 6 and 7, respectively.

The intermediate carrier frame 3, on the other hand is not a multiple-plate; rather, two frames 11 are provided which are located opposite one another, guide grooves 13 being formed, in each instance, in their end faces 12 which face one another.

The guide grooves 10, 13 serve to receive thick-film hybrid substrates 14, wherein a thick-film hybrid substrate is held only in the guide grooves 13 by the intermediate carrier frame 3, while the thick-film hybrid substrates 14 in the cover frame 2, the intermediate carrier 4 and the base frame 5 also contact the metal plates 6 and 7, respectively, in this area. The thick-film hybrid substrates 14 can be glued on the metal plates 6 and 7, respectively, wherein, for example, the metal plate 6 of the base frame 5 or an output stage, e.g. a transistor or semiconductor output stage or the like, can possibly be glued on simultaneously with a cover plate.

As shown in FIG. 2, the metal frames 2-5 are pierced with screw connection channels 15 in which are inserted screw bolts, not shown in more detail, with which the metal frames 2-5 are tightened together relative to the metal housing 1.

The back of the metal housing 1 shown in FIG. 3 is provided with a sealing groove 16; a projection 18, which is formed onto a cover 17 shown in FIG. 4, engages and is glued in the sealing groove 16 in the use position.

The front of the metal housing 1 shown in FIG. 1 also comprises a sealing groove 19, in which a masking section 20 engages by means of a projection 21. The masking section 20 is penetrated by a plug 22 in which contact holes 23 are formed. The contact hole 23 communicates with a connection board (printed circuit board) 25 via a contact pin 24. Connection lugs 26 from the thick-film hybrid substrates 14 open into this connection board 25.

While the invention has been illustrated and described as embodied in a multiple-plate hybrid device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A multiple-plate hybrid device comprising a plurality of film hybrid substrates having hybrid connections with high heat losses; a plurality of metal frames stacked one on top of the other and forming a metal housing which supports said plurality of film hybrid substrates and provides heat dissipation conduction through said metal housing, each of said metal frames having an U-shaped cross-section and including a metal base plate, adjoining a respective film hybrid substrate, and opposite legs adjacent said metal base plate, said opposite legs having guide grooves which receive said respective film hybrid substrate therein, said respective film hybrid substrates each having an outer surface which contacts said metal base plate along an entire area of said outer surface of said respective film hybrid substrate.

2. A multiple-plate hybrid device according to claim 1, wherein said film hybrid substrate is glued to the respective metal base plate.

3. A multiple-plate hybrid device according to claim 1, wherein said metal frames comprise upper and lower frames, and an intermediate carrier frame located therebetween, said intermediate carrier frame having an inner end face and a guiding groove formed in said inner end face and which receives a respective film hybrid substrate.

4. A multiple-plate hybrid device according to claim 1, further comprising a plurality of screw connection channels piercing said metal frames.

5. A multiple-plate hybrid device according to claim 1, wherein said metal housing has back and front surfaces and a groove formed in each of said back and front surfaces.

6. A multiple-plate hybrid device according to claim 5, further comprising a cover having a projection engaging one of said grooves.

7. A multiple-plate hybrid device according to claim 1, further comprising a connection board, said film hybrid substrates having connection lugs projecting into said connection board.

8. A multiple-plate hybrid device according to claim 7, further comprising a plug located in said metal housing and having contact pins extending into said connection board, said plug having contact holes accessible from outside of said metal housing.

9. A multiple-plate hybrid device comprising a plurality of film hybrid substrates having hybrid connections with high heat losses; a plurality of metal frames stacked one on top of the other and forming a metal housing which supports said plurality of film hybrid substrates and provides heat dissipation conduction through said metal housing, each of said metal frames having an U-shaped cross-section and including a metal base plate, adjoining a respective film hybrid substrate, and opposite legs adjacent said metal base plate, said opposite legs having guide grooves which receive said respective film hybrid substrate therein; a connection board, said film hybrid substrates having connection lugs projecting into said connection board; and a plug located in said metal housing and having contact pins extending into said connection board, said plug having contact holes accessible from outside of said metal housing, said housing having a front surface having a groove therein, said device further comprising a masking section having a projection extending into said groove, said plug extending through said masking section.

* * * * *